US009514850B2

(12) United States Patent
Kim

(10) Patent No.: US 9,514,850 B2
(45) Date of Patent: Dec. 6, 2016

(54) MEMORY DEVICE WITH IMPROVED REFRESH SCHEME FOR REDUNDANCY WORD LINE

(71) Applicant: SK hynix Inc., Gyeonggi-do (KR)

(72) Inventor: Sang-Hee Kim, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 75 days.

(21) Appl. No.: 14/569,311

(22) Filed: Dec. 12, 2014

(65) Prior Publication Data

US 2016/0027532 A1  Jan. 28, 2016

(30) Foreign Application Priority Data

Jul. 22, 2014 (KR) .................. 10-2014-0092653

(51) Int. Cl.
*G11C 7/06* (2006.01)
*G11C 29/00* (2006.01)
*G11C 11/406* (2006.01)

(52) U.S. Cl.
CPC ............. *G11C 29/83* (2013.01); *G11C 11/406* (2013.01); *G11C 29/781* (2013.01)

(58) Field of Classification Search
CPC ........ G11C 29/83; G11C 11/406; G11C 29/781
USPC .......................................... 365/200
See application file for complete search history.

(56) References Cited

U.S. PATENT DOCUMENTS

| 8,072,827 | B2 | 12/2011 | Wakimoto | |
|---|---|---|---|---|
| 9,190,139 | B2* | 11/2015 | Jung | G11C 8/08 |
| 2015/0049567 | A1* | 2/2015 | Chi | G11C 7/02 365/222 |
| 2015/0170728 | A1* | 6/2015 | Jung | G11C 8/08 365/222 |

FOREIGN PATENT DOCUMENTS

KR   1020060038808   5/2006

* cited by examiner

*Primary Examiner* — Pho M Luu
*Assistant Examiner* — Xiaochun L Chen
(74) *Attorney, Agent, or Firm* — IP & T Group LLP

(57) ABSTRACT

A memory device includes a plurality of redundancy word lines each of which is coupled with a plurality of redundancy memory cells, and a redundancy refresh circuit suitable for sequentially refreshing first redundancy word lines that are selected as target word lines for an additional refresh operation among the plurality of the redundancy word lines.

20 Claims, 8 Drawing Sheets

FIG. 8A

RWL0 (X)
RWL1 (X)
RWL2 (X)
RWL3 (X)
RWL4 (X)
RWL5 (X)
RWL6 (X)
RWL7 (X)

EN = DISABLED
SEL<0:2> = don't care

FIG. 8B

RWL0 (WL3)
RWL1 (WL100)
RWL2 (WL151)
RWL3 (WL312)
RWL4 (X)
RWL5 (X)
RWL6 (X)
RWL7 (X)

EN = ENABLED
SEL<0:2> = 3

FIG. 9A

RWL0 (WL32) ─────────────
RWL1 (X) ─────────────
RWL2 (WL63) ─────────────
RWL3 (X) ─────────────
RWL4 (WL230) ─────────────
RWL5 (X) ─────────────
RWL6 (WL401) ─────────────
RWL7 (X) ─────────────

EN = DISABLED
SEL<0:2> = don't care

FIG. 9B

RWL0 (WL32) ─────────────
RWL1 (WL413) ─────────────
RWL2 (WL63) ─────────────
RWL3 (WL472) ─────────────
RWL4 (WL230) ─────────────
RWL5 (X) ─────────────
RWL6 (WL401) ─────────────
RWL7 (X) ─────────────

EN = ENABLED
SEL<0:2> = 4

MEMORY DEVICE WITH IMPROVED REFRESH SCHEME FOR REDUNDANCY WORD LINE

CROSS-REFERENCE TO RELATED APPLICATIONS

The present application claims priority of Korean Patent Application No. 10-2014-0092653 filed on Jul. 22, 2014, which is incorporated herein by reference in its entirety.

BACKGROUND

1. Field

Exemplary embodiments of the present invention relate to a memory device.

2. Description of the Related Art

As the integration degree of memories increases, the gap between word lines that are in the memories decreases. The narrowing of the gap between word lines increases coupling effects between neighboring word lines.

Whenever data is inputted/outputted to/from a memory cell a word line toggles between an active state and an inactive state. However, as the coupling effect between the neighboring word lines increases, as mentioned above, the data of memory cells coupled with the word lines disposed adjacent to frequently activated word lines may be damaged or lost. This phenomenon is referred to as word line disturbance. Word line disturbance may damage data of memory cells before the memory cells are refreshed.

FIG. 1 illustrates a portion of a cell array included in a memory and describes a word line disturbance effect. The drawing describes the word line disturbance phenomenon.

In FIG. 1, a reference symbol 'WLK' represents a word line that is frequently activated, and reference symbols 'WLK−1' and 'WLK+1' represent word lines disposed adjacent to the frequently activated word line WLK. Also, reference symbol 'CELL_K+1' represents a memory cell coupled with the frequently activated word line WLK, and reference symbol 'CELL_K−1' represents a memory cell coupled with the word line WLK−1. Reference symbol 'CELL_K+1' represents a memory cell coupled with the word line WLK+1. The memory cells CELL_K, CELL_K−1 and CELL_K+1 include cell transistors TR_ K, TR_K−1 and TR_K+1 and cell capacitors CAP_K, CAP_K−1 and CAP_K+1 respectively.

In FIG. 1, when the frequently activated word line WLK is activated or deactivated, the voltages of the word line WLK−1 and the word line WLK+1 rise or drop due to the coupling effect occurring between the word line WLK and the word lines WLK−1 and WLK+1, affecting the amount of charge stored in the cell capacitors CAP_K−1 and CAP_K+1. Therefore, when the word line WLK is frequently activated and thus the word line WLK toggles between the active state and the inactive state, the change in the amount of charge stored in the cell capacitors CAP_K−1 and CAP_K+1 included in the memory cells CELL_K−1 and CELL_K+1 is increased, thus deteriorating the data of the memory cells CELL_K−1 and CELL_K+1.

Also, electromagnetic waves generated while the word line WLK toggles between the active state and the inactive state induces the movement of electrons in or out of the cell capacitors of the memory cells coupled with the neighboring word lines WLK−1 and WLK+1, thus damaging the data of the memory cells.

The phenomenon that a particular word line, e.g., the word line WLK, is repeatedly activated more than a predetermined number of times and thus the data of the memory cells coupled with the neighboring word lines, e.g., word lines WLK−1 and WLK+1, are affected by the frequently activated word line WLK is called 'a row hammer effect'. Among the methods used to address the row hammer effect is a method of performing an active operation on the neighboring word lines WLK−1 and WLK+1 disposed adjacent to the frequently activated word line WLK. Through the active operation performed on the neighboring word lines WLK−1 and WLK+1, the data of the memory cells coupled with the neighboring word lines WLK−1 and WLK+1 are programmed again, preventing the data from being damaged. However, such a method used to address the row hammer effect may not be applied to redundancy word lines, and this is described below with reference to FIG. 2.

FIG. 2 illustrates word lines WL0 to WL511 and redundancy word lines RWL0 to RWL7. FIG. 2 shows a case where a word line WL3 is replaced with a redundancy word line RWL2.

When a word line WL3 is replaced with a redundancy word line RWL2, as shown in FIG. 2, and the word line WL3 is repeatedly accessed more than a predetermined number of times, the redundancy word line RWL2 is actually activated more than the predetermined number of times. In this case, activating the neighboring word lines WL2 and WL4, which are disposed adjacent to the word line WL3, does nothing for the prevention of the row hammer effect. This is because the memory cells that are likely to lose their data due to the frequent access to the word line WL3 are not the memory cells coupled with the word lines WL2 and WL4, but the memory cells coupled with redundancy word lines RWL1 and RWL3.

SUMMARY

An embodiment of the present invention is directed to diverse techniques for preventing a row hammer effect in a redundancy region.

In accordance with an embodiment of the present invention, a memory device includes a plurality of redundancy word lines, each of which is coupled with a plurality of redundancy memory cells, and a redundancy refresh circuit suitable for sequentially refreshing first redundancy word lines that are selected as target word lines for an additional refresh operation among the plurality of the redundancy word lines.

The first redundancy word lines may be selected as the target word lines based on the number of second redundancy word lines that are used for a repair operation among the plurality of the redundancy word lines.

Redundancy word lines that are used for the repair operation among the plurality of the redundancy word lines may be included in the first redundancy word lines.

In the memory device, odd-numbered redundancy word lines may be used for a repair operation after even-numbered redundancy word lines are all used for repair operations.

The first redundancy word lines may be selected as the target word lines based on the number of third redundancy word lines that are used for the repair operation among the odd-numbered redundancy word lines.

When no word line is used for the repair operation among the odd-numbered redundancy word lines, there may be no target word line for the additional refresh operation.

In the memory device, even-numbered redundancy word lines may be used for a repair operation after all odd-numbered redundancy word lines are used for the repair operation.

The first redundancy word lines may be selected as the target word lines based on the number of fourth redundancy word lines that are used for the repair operation.

When no word line is used for the repair operation among the even-numbered redundancy word lines, there may be no target word line for the additional refresh operation.

In accordance with another embodiment of the present invention, a memory device includes a plurality of normal word lines, each of which is coupled with a plurality of normal memory cells, a plurality of redundancy word lines, each of which is coupled with a plurality of redundancy memory cells, a normal refresh circuit suitable for sequentially refreshing unrepaired normal word lines among the plurality of the normal word lines and first redundancy word lines that are used for a repair operation among the plurality of the redundancy word lines, when a refresh signal is enabled; and a redundancy refresh circuit suitable for sequentially refreshing second redundancy word lines that are selected as target word lines for an additional refresh operation among the plurality of the redundancy word lines, when a redundancy refresh signal is enabled.

The redundancy refresh signal may be enabled whenever the refresh signal is enabled a predetermined number of times.

The redundancy refresh circuit may include a counting unit suitable for increasing a value of a code whenever the redundancy refresh signal is enabled, a refresh enabling signal generation unit suitable for generating a plurality of refresh enabling signals corresponding to the plurality of the redundancy word lines by decoding the code, and an initialization unit suitable for initializing the code when the value of the code reaches a set value, wherein the set value is decided based on the number of the second redundancy word lines.

The second redundancy word lines may be selected as the target word lines based on the number of the first redundancy word lines The first redundancy word lines may be included in the second redundancy word lines.

In the memory device, odd-numbered redundancy word lines may be used for the repair operation after even-numbered redundancy word lines are all used for the repair operation.

The second redundancy word lines may be selected as the target word lines based on the number of third redundancy word lines that are used for the repair operation.

When no word line is used for the repair operation among the odd-numbered redundancy word lines, there may be no target word line for the additional refresh operation.

In the memory device, even-numbered redundancy word lines may be used for the repair operation after odd-numbered redundancy word lines are all used for the repair operation.

The second redundancy word lines may be selected as the target word lines based on the number of fourth redundancy word lines that are used for the repair operation.

When no word line is used for the repair operation among the even-numbered redundancy word lines, there may be no target word line for the additional refresh operation.

In accordance with a further embodiment of the present invention, a memory device includes a plurality of redundancy word lines suitable for repairing a plurality of normal word lines, a normal refresh circuit suitable for sequentially refreshing first redundancy word lines that are used to repair the plurality of the normal word lines among the plurality of the redundancy word lines, for a refresh operation, and a redundancy refresh circuit suitable for sequentially refreshing second redundancy word lines that are selected as target word lines among the first redundancy word lines, for an additional refresh operation which is performed once when the refresh operation is performed a predetermined number of times.

The second redundancy word lines may be selected as the target word lines based on the number of the first redundancy word lines

BRIEF DESCRIPTION OF THE DRAWINGS

FIGS. 8A and 8B illustrate a first application example of the memory device of FIGS. 5 to 7.

FIGS. 9A and 9B illustrate a second application example of the memory device of FIGS. 5 to 7.

DETAILED DESCRIPTION

Figure 1:
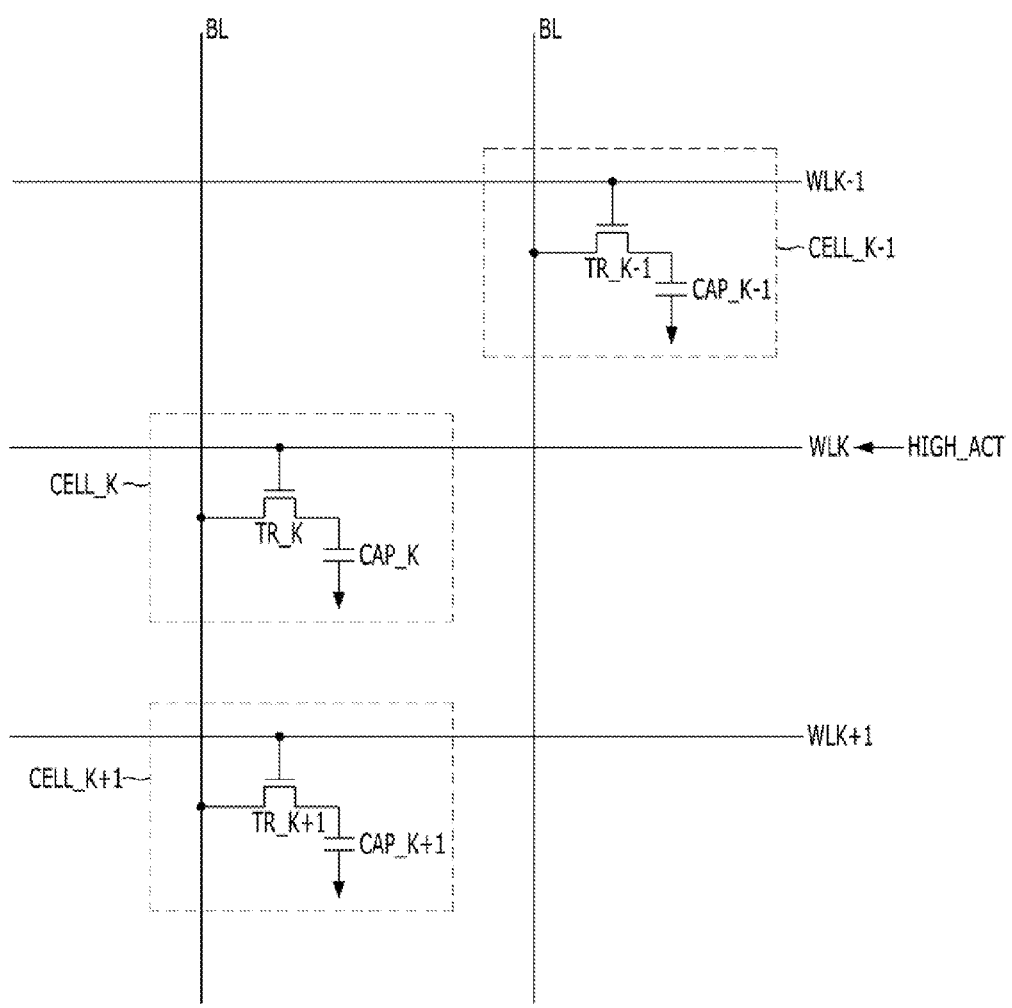
FIG. 1 illustrates a portion of a cell array included in a memory and describes a word line disturbance effect.
Figure 2:
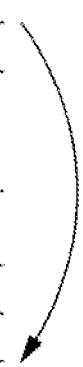
FIG. 2 illustrates word lines WL0 to WL511 and redundancy word lines RWL0 to RWL7.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
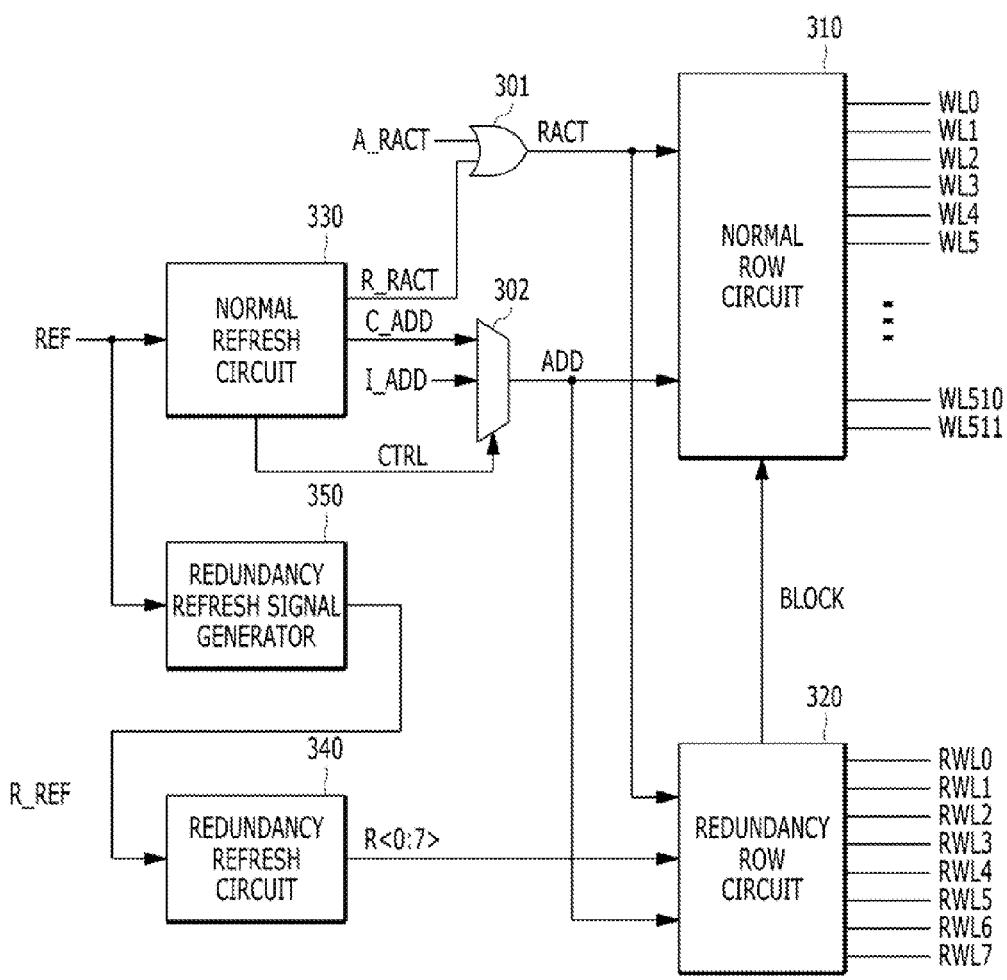
FIG. 3 is a block view illustrating a memory device in accordance with an embodiment of the present invention.

FIG. 3 is a block view illustrating a memory device in accordance with an embodiment of the present invention.

Referring to FIG. 3, the memory device may include normal word lines WL0 to WL511, redundancy word lines RWL0 to RWL7, a normal row circuit 310, a redundancy row circuit 320, a normal refresh circuit 330, a redundancy refresh circuit 340, and a redundancy refresh signal generator 350.

The normal row circuit 310 may activate a normal word line that is selected based on an address ADD among the normal word lines WL0 to WL511 when a row active signal RACT is enabled. A reference symbol 'A_RACT' represents a first row active signal that is enabled during an active operation (when an active command is applied to the memory device), and a reference symbol 'R_RACT' represents a second row active signal that is enabled during a refresh operation (when a refresh command is applied to the memory device). Since the first row active signal A_RACT and the second row active signal R_RACT are combined in an OR gate 301 to generate the row active signal RACT, the row active signal RACT may be enabled when one between the first row active signal A_RACT and the second row active signal R_RACT is enabled. During the active operation, an external address I_ADD inputted from the outside (e.g. an external source or device) of the memory device is transmitted as the address ADD, and during the refresh operation, a counting address C_ADD generated in the normal refresh circuit 330 may be transmitted as the address ADD. A selector 302 selects one between the external address I_ADD and the counting address C_ADD and transmits the selected address as the address ADD. The selector 302 may be controlled by the normal refresh circuit 330. A block signal BLOCK is a signal for preventing a normal word line corresponding to the address ADD from being activated when the normal word line corresponding to the address ADD is replaced with one of the redundancy word lines RWL0 to RWL7. When the block signal BLOCK is enabled, the normal row circuit 310 may not activate the normal word line although the row active signal RACT is enabled.

The normal refresh circuit 330 may sequentially refresh the normal word lines that are not repaired among the normal word fines WL0 to WL511 and the repaired redundancy word lines when a refresh signal REF is enabled. For example, when a normal word line WL123 is repaired with a redundancy word line RWL2, the normal refresh circuit 330 may sequentially activate the normal word lines WL0 to WL122 and WL124 to WL511 and the redundancy word line RWL2 one by one whenever the refresh signal REF is enabled. The refresh signal REF may be enabled when a refresh command is applied from a memory controller to the memory device. The normal refresh circuit 330 enables the second row active signal R_RACT in response to the enabling of the refresh signal REF. Whenever the refresh signal REF is enabled, the normal refresh circuit 330 may increase the value of the counting address C_ADD by '1'. Also, the normal refresh circuit 330 may generate a control signal CNTL for controlling the selector 302 to select the counting address C_ADD during the refresh operation, and to select the external address I_ADD otherwise.

The redundancy row circuit 320 may activate a redundancy word line instead of a repaired normal word line among the normal word lines WL0 to WL511. For example, when a normal word line WL310 is repaired with a redundancy word line RWL1 and an address ADD corresponding to the normal word line WL310 is inputted, the redundancy row circuit 320 may activate the redundancy word line RWL1 and enable the block signal BLOCK. In other words, the redundancy row circuit 320 may prevent the defective normal word line WL310 from being activated among the normal word lines WL0 to WL511 and may activate the redundancy word line RWL1, which replaces the defective normal word line WL310. The redundancy row circuit 320 may activate a redundancy word line in substitution of a defective normal word line among the normal word lines WL0 to WL511 in the same manner both during the active operation and during the refresh operation.

The redundancy refresh signal generator 350 may enable a redundancy refresh signal R_REF whenever the refresh signal REF is enabled a predetermined number of times. For example, when the refresh signal REF is enabled 10 times, the redundancy refresh signal generator 350 may enable the redundancy refresh signal R_REF. The redundancy refresh signal R_REF may be a signal for additionally refreshing the redundancy word lines RWL0 to RWL7 other than a general refresh operation.

The redundancy refresh circuit 340 may sequentially refresh the redundancy word lines RWL0 to RWL7 whenever the redundancy refresh signal R_REF is enabled. The refresh operation performed by the redundancy refresh circuit 340 on the redundancy word lines RWL0 to RWL7 may be additionally performed independently from the refresh operation performed by the normal refresh circuit 330. The redundancy word lines RWL0 to RWL7 may be frequently refreshed due to the additional refresh operation performed by the redundancy refresh circuit 340 on the redundancy word lines RWL0 to RWL7. Therefore, the row hammer effect does not occur in the redundancy word lines RWL0 to RWL7. In the drawing, a reference symbol R<0:7> may represent signals generated by the redundancy refresh circuit 340 to refresh the redundancy word lines RWL0 to RWL7.

Although FIG. 3 exemplarily shows a case where there are 512 normal word lines WL0 to WL511 and 8 redundancy word lines RWL0 to RWL7, for a simple description, the number of the normal word lines WL0 to WL511 and the number of the redundancy word lines RWL0 to RWL7 may be changed.

Figure 4:
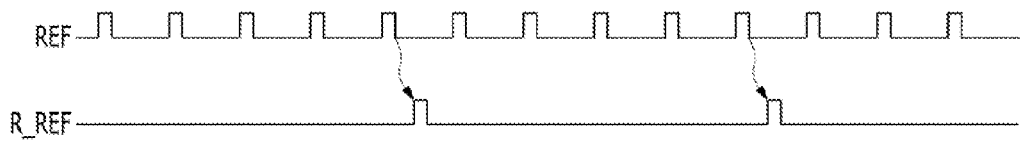
FIG. 4 illustrates a redundancy refresh signal R_REF generated in a redundancy refresh signal generator 350.

FIG. 4 illustrates the redundancy refresh signal R_REF generated in the redundancy refresh signal generator 350.

Referring to FIG. 4, it may be seen that the redundancy refresh signal R_REF is enabled once whenever the refresh signal REF is enabled five tires. While the refresh signal REF is enabled 512 times, the normal word lines WL0 to WL511 are refreshed once but the redundancy word lines RWL0 to RWL7 may be refreshed more than 12 times (512/5/8). The refresh operations may be performed on the redundancy word lines RWL0 to RWL7 more than 12 times as much as the refresh operations performed on the normal word lines WL0 to WL511.

The row hammer effect is a phenomenon where the data of memory cells coupled with word lines adjacent to a highly activated word line is damaged. Since the redundancy word lines RWL0 to RWL7 are refreshed frequently, they may not be affected by the row hammer effect.

Figure 5:
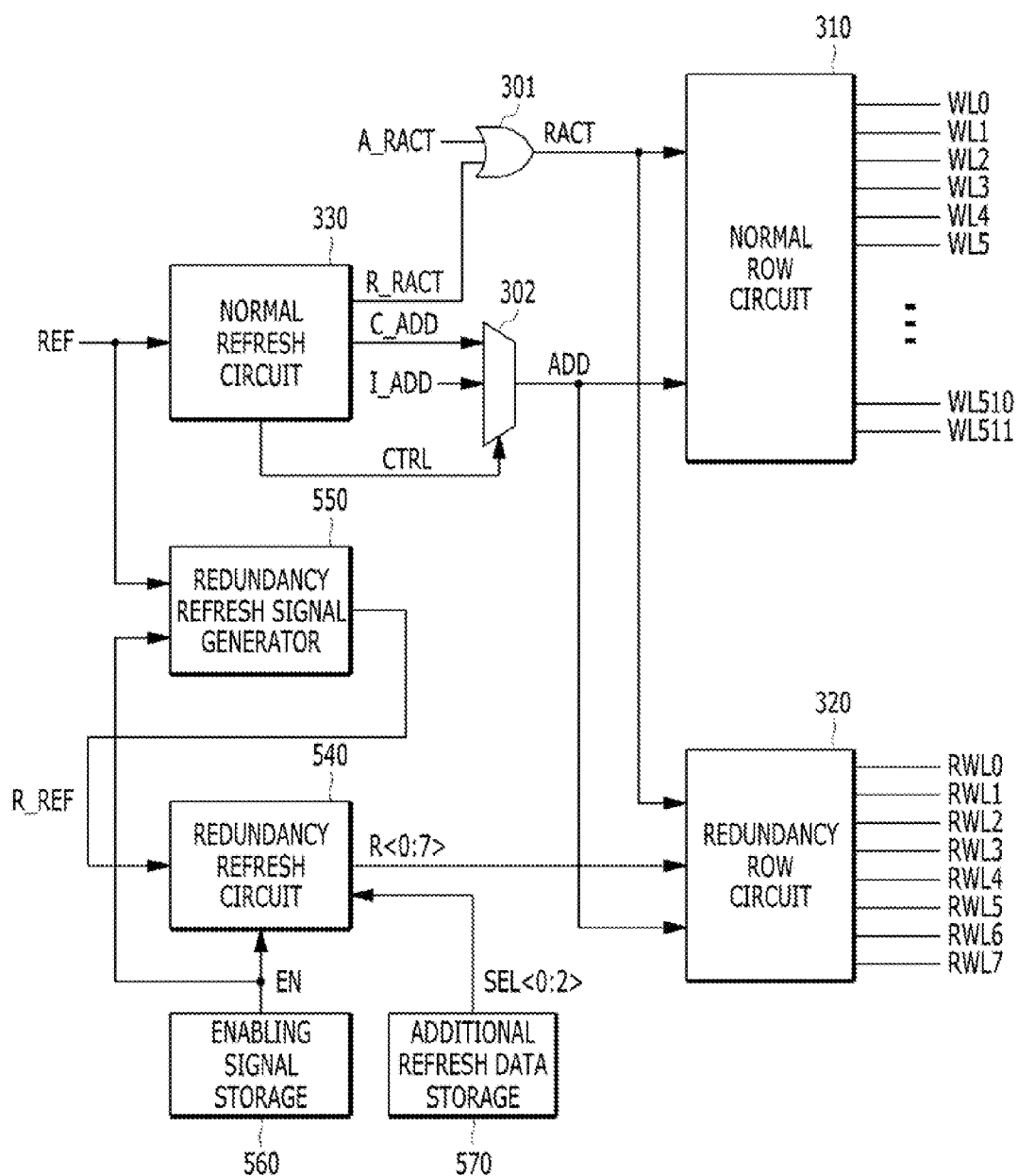
FIG. 5 is a block view illustrating a memory device in accordance with another embodiment of the present invention.

FIG. 5 is a block view illustrating a memory device in accordance with another embodiment of the present invention. In this embodiment of the present invention, a redundancy refresh circuit 540 and a redundancy refresh signal generator 550 may be activated or deactivated, and some of the redundancy word lines RWL0 to RWL7 may be included in the range of the target redundancy word lines for an additional refresh operation.

Referring to FIG. 5, the memory device may further include an enabling signal storage 560 and an additional refresh data storage 570 in addition to the constituent structures of the memory device shown in FIG. 3. Also, the redundancy refresh circuit 540 and the redundancy refresh signal generator 550 may be designed differently from those shown in FIG. 3.

The enabling signal storage 560 may store an enabling signal EN for enabling/disabling an additional refresh operation. When the enabling signal EN is enabled, the redundancy refresh signal generator 550 and the redundancy refresh circuit 540 are activated to perform an additional refresh operation on the redundancy word lines. Also, when the enabling signal EN is disabled, the redundancy refresh signal generator 550 and the redundancy refresh circuit 540 are deactivated and do not perform an additional refresh operation on the redundancy word lines. The enabling signal storage 560 may be a fuse circuit or an e-fuse circuit for storing the enabling signal EN, or it may be one of the diverse kinds of circuits capable of storing signals.

The additional refresh data storage 570 may store a set value SEL<0:2> which is data for selecting redundancy word lines on which an additional refresh operation is to be performed among the redundancy word lines RWL0 to RWL7. The redundancy refresh circuit 540 does not refresh all the redundancy word fines RWL0 to RWL7, but refreshes the redundancy word lines that are selected as the targets for the additional refresh operation based on the set value SEL<0:2>. The additional refresh data storage 570 may be a fuse circuit or an e-fuse circuit, or one of the diverse types of circuits capable of storing signals.

All the redundancy word lines RWL0 to RWL7 may be used for the repair operation, or only some of the redundancy word lines RWL0 to RWL7 may be used for the repair operation, or none of the redundancy word lines RWL0 to RWL7 may be used for the repair operation. Therefore, an additional refresh operation does not have to be performed on all of the redundancy word lines RWL0 to RWL7. In the memory device shown in FIG. 5, the additional refresh operation is performed on only some of the redundancy word lines RWL0 to RWL7 or the additional refresh operation may not be performed at all.

Figure 6:
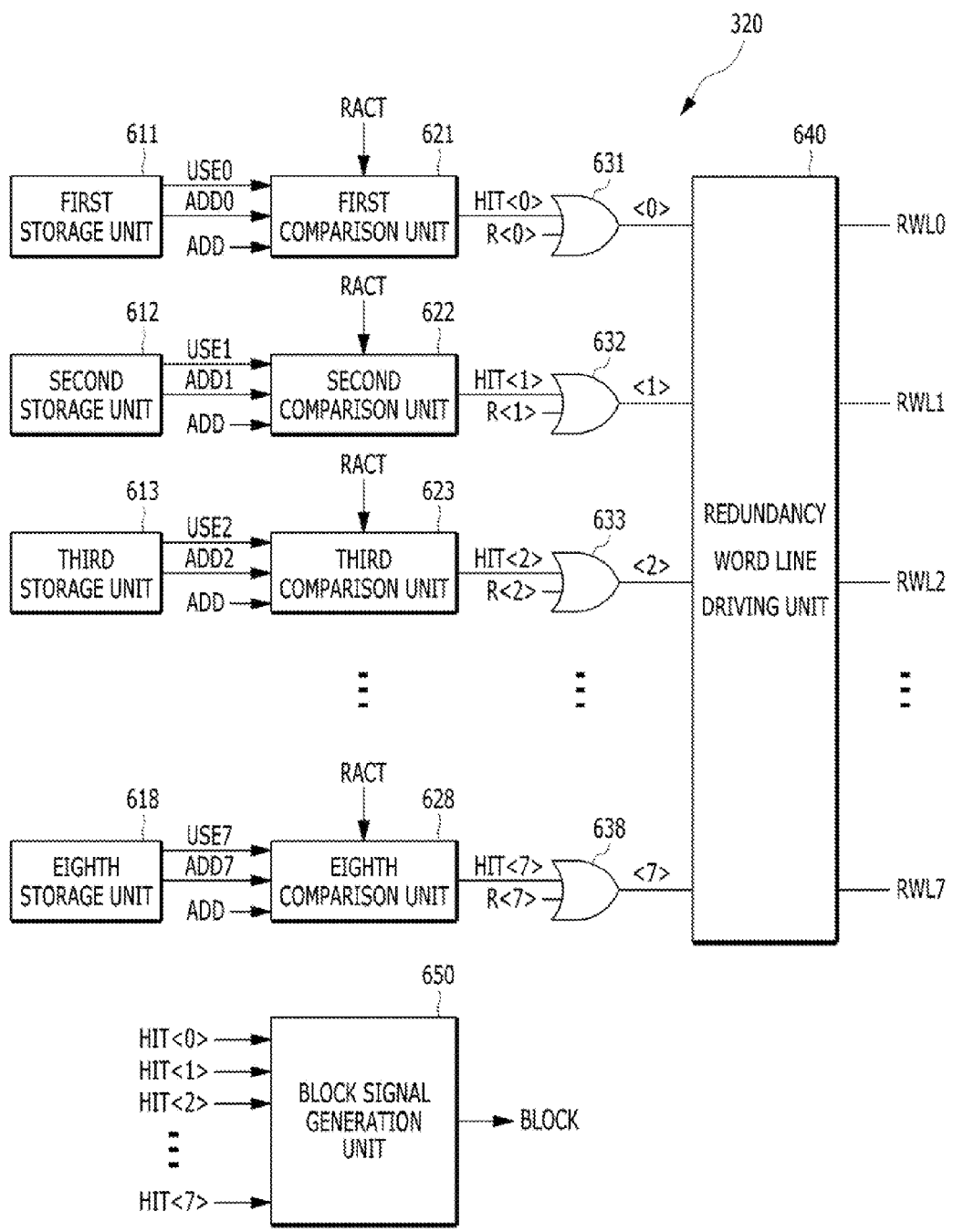
FIG. 6 is a block view illustrating a redundancy row circuit 320 shown in FIG. 5.

FIG. 6 is a block view illustrating the redundancy row circuit 320 shown in FIG. 5.

Referring to FIG. 6, the redundancy row circuit 320 may include first to eighth storage units 611 to 618, first to eighth comparison units 621 to 628, first to eighth OR gates 631 to 638, a redundancy word line driving unit 640, and a block signal generation unit 650.

The first to eighth storage units 611 to 618 may store usage information USE0 to USE7 and addresses ADD0 to ADD7 corresponding to the normal word lines to be replaced with the redundancy word lines RWL0 to RWL7. The first storage unit 611 may store the address ADD0 of the normal word line to be replaced with the redundancy word line RWL0, and the second storage unit 612 may store the address ADD1 of the normal word line to be replaced with the redundancy word line RWL1. Likewise, the third to eighth storage units 613 to 618 may store the addresses ADD2 to ADD7 of the normal word lines to be replaced with the redundancy word lines RWL2 to RWL7. The usage information USE0 to USE7 may represent whether the redundancy word lines RWL0 to RWL7 are used for the repair operation. When the usage information USE0 to USE7 is disabled, the redundancy word lines RWL0 to RWL7 may not be used for the repair operation (in other words, no normal word lines are replaced with the redundancy word lines). For example, when the usage information USE3 is disabled, the redundancy word line RWL3 does not replace any normal word line. The first to eighth storage units 611 to 618 may be fuse circuits or e-fuse circuits, and they may be circuits of diverse kinds that are capable of storing signals.

The first to eighth comparison units 621 to 628 may generate hit signals HIT<0> to HIT<7> by comparing the address ADD and the addresses ADD0 to ADD7 stored in the first to eighth storage units 611 to 618 when the usage information USE0 to USE7 and a row active signal RACT are enabled. To be specific, when the row active signal RACT enabled while the usage information USE0 to USE7 is enabled and when the address ADD coincides with the addresses ADD0 to ADD7 corresponding thereto, the first to eighth comparison units 621 to 628 enable the hit signals HIT<0> to HIT<7>. Otherwise, the first to eighth comparison units 621 to 628 disable the hit signals HIT<0> to HIT<7>. For example, when the usage information USE2 stored in the third storage unit 613 is enabled and the address ADD2 stored in the third storage unit 613 corresponds to the normal word line WL200, the third comparison unit 623 may enable the hit signal HIT<2> when the row active signal RACT is enabled and the address ADD corresponds to the normal word line WL200. The enabling of the hit signal HIT<2> leads to the enabling of the redundancy word line RWL2 that substitutes for the normal word line WL200.

The first to eighth OR gates 631 to 638 may enable signals <0> to <7> for enabling the redundancy word lines RWL0 to RWL7, when one signal between the hit signals HIT<0> to HIT<7> and refresh enabling signals R<0> to R<7> inputted thereto is enabled. For example, when one between the hit signal HIT<3> and the refresh enabling signal R<3> is enabled, the fourth OR gate 634 may enable the signal <3> for enabling the redundancy word line RWL3.

The block signal generation unit 650 may enable a block signal BLOCK to prevent the normal word lines WL0 to WL511 from being activated, when more than one signal among the hit signals HIT<0> to HIT<7> is enabled.

Figure 7:
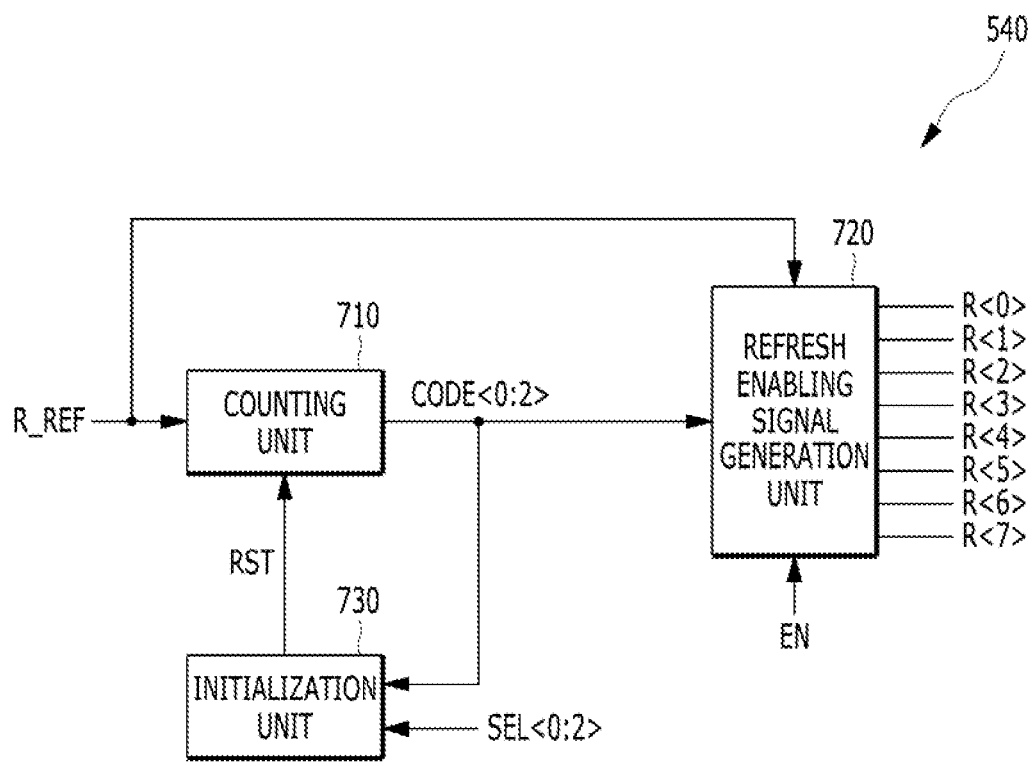
FIG. 7 is a block view illustrating a redundancy refresh circuit 540 shown in FIG. 5.

FIG. 7 is a block view illustrating the redundancy refresh circuit 540 shown in FIG. 5.

Referring to FIG. 7, the redundancy refresh circuit 540 may include a counting unit 710, a refresh enabling signal generation unit 720, and an initialization unit 730.

The counting unit 710 may increase the value of a code CODE<0:2>, which is a binary code, whenever the redundancy refresh signal R_REF is enabled. For example, when the redundancy refresh signal R_REF is enabled for the first time, the value of the code CODE<0:2> may be '0', and when the redundancy refresh signal R_REF is enabled for the second time, the value of the code CODE<0:2> may be '1'.

The refresh enabling signal generation unit 720 may decode the code CODE<0:2> when the redundancy refresh signal R_REF is enabled and enable one of the refresh enabling signals R<0> to R<7>. For example, when the redundancy refresh signal R_REF is enabled and the value of the code CODE<0:2> is the refresh enabling signal generation unit 720 may enable the refresh enabling signal R<3>. When the refresh enabling signals R<0> to R<7> are enabled, the redundancy word line driving unit 640 may enable the redundancy word lines corresponding to the enabled refresh enabling signals R<0> to R<7>. Meanwhile, when the enabling signal EN is disabled, the refresh enabling signal generation unit 720 may be deactivated.

The initialization unit 730 may enable a reset signal RST and initialize the counting unit 710, when the value of the code CODE<0:2> reaches a set value SEL<0:2>. For example, when the set value SEL<0:2> is '5' and the value of the code CODE<0:2> reaches '5', the initialization unit 730 may initialize the counting unit 710. The number of redundancy word lines that are targeted for an additional refresh operation among the redundancy word lines RWL0 to RWL7 may be changed by controlling the set value SEL<0:2>. For example, when the set value SEL<0:2> is '4', the refresh enabling signals R<0> to R<7> are repeatedly enabled in the order of R<0>, R<1>, R<2>, R<3>, R<4>, R<0>, R<1>, R<2>, R<3>, R<4>, R<0>, . . . whenever the redundancy refresh signal R_REF is enabled. In this case, the redundancy word lines RWL0 to RWL4 among the redundancy word lines RWL0 to RWL7 become the targets for the additional refresh operation. Likewise, when the set value SEL<0:2> is '6', the redundancy word lines RWL0 to RWL6 among the redundancy word lines RWL0 to RWL7 may become the targets for the additional refresh operation.

In the above description, a memory device capable of deactivating an additional refresh operation or setting redundancy word lines that are targeted for additional refresh operations are described with reference to FIGS. 5 to 7. Described hereafter is the application of the memory device.

FIGS. 8A and 8B illustrate a first application example of the memory device of FIGS. 5 to 7.

Referring to FIG. 8A, none of the redundancy word lines RWL0 to RWL7 are used for the repair operation (a reference symbol 'X' represents that the redundancy word line is not used for the repair operation). In this case, a disabled enabling signal EN is stored in the enabling signal storage 560, and an additional refresh operation may not be performed. Since the redundancy word lines RWL0 to RWL7 are not used at all for the repair operation in this case, an additional refresh operation does not need to be performed. When the additional refresh operation is not performed, the set value SEL<0:2> may have no meaning.

Referring to FIG. 8B, the redundancy word lines RWL0 to RWL3 are used for the repair operation (what is written in parentheses is the normal word lines that are replaced with the redundancy word lines), and the redundancy word lines RWL4 to RWL7 are not used for the repair operation. In this case, the enabling signal storage 560 stores the enabled enabling signal EN, and an additional refresh operation may be performed. The set value SEL<0:2> is decided based on the number of the redundancy word lines RWL0 to RWL3 that are used for the repair operation. In this case, the set value SEL<0:2> may be set to '3'. Therefore, the redundancy word lines RWL0 to RWL3 among the redundancy word lines RWL0 to RWL7 may become the targets for the additional refresh operation. In this case, whenever the redundancy refresh signal R_REF is enabled, the redundancy word lines RWL0 to RWL3 are sequentially refreshed. Therefore, the refresh operation may be performed more frequently on the redundancy word lines RWL0 to RWL3 used for the repair operation and the tolerance to the row hammer effect on the redundancy region may be stronger in this case than the case where all the redundancy word lines RWL0 to RWL7 become the targets for the additional refresh operation.

FIGS. 9A and 9B illustrate a second application example of the memory device of FIGS. 5 to 7. Herein, it is described as an example that the odd-numbered redundancy word lines RWL1, RWL3, RWL5 and RWL7 are used for the repair operation after the even-numbered redundancy word lines RWL0, RWL2, RWL4 and RWL6 are all used for the repair operation.

Referring to FIG. 9A, the even-numbered redundancy word lines RWL0, RWL2, RWL4 and RWL6 are used for the repair operation, and the odd-numbered redundancy word lines RWL1, RWL3, RWL5 and RWL7 are not used for the repair operation. Although the even-numbered redundancy word lines RWL0, RWL2, RWL4 and RWL6 are used for the repair operation, the even-numbered redundancy word lines RWL0, RWL2, RWL4 and RWL6 are not disposed adjacent to each other. Therefore, the row hammer effect does not occur in the redundancy region, the disabled enabling signal EN is stored in the enabling signal storage 560, and the additional refresh operation may not be performed. In short, when only the even-numbered redundancy word lines RWL0, RWL2, RWL4 and RWL6 are used for the repair operation, the additional refresh operation does not have to be performed.

Referring to FIG. 9B, the even-numbered redundancy word lines RWL0, RWL2, RWL4 and RWL6 and some odd-numbered redundancy word lines RWL1 and RWL3 are used for the repair operation. In this case, the redundancy word lines RWL0 to RWL4 may suffer from the row hammer effect. Therefore, the enabled enabling signal EN is stored in the enabling signal storage 560, and the additional refresh operation may be performed. Also, the set value SEL<0:2> may be set to '4' based on the number of the odd-numbered redundancy word lines RWL1 and RWL3 that are used for the repair operation.

Since the odd-numbered redundancy word lines RWL1, RWL3, RWL5 and RWL7 are used after all of the even-numbered redundancy word lines RWL0, RWL2, RWL4 and RWL6 are used for the repair operation in FIGS. 9A and 9B, the additional refresh operation is not performed an increasing number of times, and a decreasing number of word lines may become the targets for the additional refresh operation. Although FIGS. 9A and 9B shows the case where the odd-numbered redundancy word lines RWL1, RWL3, RWL5 and RWL7 are used after the even-numbered redundancy word lines RWL0, RWL2, RWL4 and RWL6 are all used, it is obvious to those skilled in the art that the even-numbered redundancy word lines may be designed to be used for the repair operation after all of the odd-numbered redundancy word lines are used for the repair operation.

According to the embodiments of the present invention, a row hammer effect in a redundancy region may be prevented.

While the present invention has been described with respect to specific embodiments, it will be apparent to those skilled in the art that various changes and modifications may be made without departing from the spirit and scope of the invention as defined in the following claims.

What is claimed is:

1. A memory device, comprising:
    a plurality of redundancy word lines, each of which is coupled with a plurality of redundancy memory cells; and
    a redundancy refresh circuit suitable for sequentially refreshing first redundancy word lines that are selected as target word lines for an additional refresh operation among the plurality of the redundancy word lines,
    wherein the first redundancy word lines are selected as the target word lines based on the total number of second redundancy word lines that are used for a repair operation among the plurality of the redundancy word lines.

2. The memory device of claim 1, wherein redundancy word lines that are used for a repair operation among the plurality of the redundancy word lines are included in the first redundancy word lines.

3. The memory device of claim 1, wherein odd-numbered redundancy word lines are used for a repair operation after even-numbered redundancy word lines are all used for the repair operation, among the plurality of the redundancy word lines.

4. The memory device of claim 3, wherein the first redundancy word lines are selected as the target word lines based on the total number of third redundancy word lines that are used for the repair operation among the odd-numbered redundancy word lines.

5. The memory device of claim 4, wherein when no word line is used for the repair operation among the odd-numbered redundancy word lines, there is no target word line for the additional refresh operation.

6. The memory device of claim 1, wherein even-numbered redundancy word lines are used for a repair operation after odd-numbered redundancy word lines are all used for the repair operation, among the plurality of the redundancy word lines.

7. The memory device of claim 6, wherein the first redundancy word lines are selected as the target word lines based on the total number of fourth redundancy word lines that are used for the repair operation among the even-numbered redundancy word lines.

8. The memory device of claim 6, wherein when no word line is used for the repair operation among the even-numbered redundancy word lines, there is no target word line for the additional refresh operation.

9. A memory device, comprising:
a plurality of normal word lines each of which is coupled with a plurality of normal memory cells;
a plurality of redundancy word lines each of which is coupled with a plurality of redundancy memory cells;
a normal refresh circuit suitable for sequentially refreshing unrepaired normal word lines among the plurality of the normal word lines and first redundancy word lines that are used for a repair operation among the plurality of the redundancy word lines, when a refresh signal is enabled; and
a redundancy refresh circuit suitable for sequentially refreshing second redundancy word lines that are selected as target word lines for an additional refresh operation among the plurality of the redundancy word lines, when a redundancy refresh signal is enabled,
wherein the redundancy refresh signal is enabled whenever the refresh signal is enabled a predetermined number of times.

10. The memory device of claim 9, wherein the redundancy refresh circuit includes:
a counting unit suitable for increasing a value of a code whenever the redundancy refresh signal is enabled;
a refresh enabling signal generation unit suitable for generating a plurality of refresh enabling signals corresponding to the plurality of the redundancy word lines by decoding the code; and
an initialization unit suitable for initializing the code when the value of the code reaches a set value,
wherein the set value is decided based on the total number of the second redundancy word lines.

11. The memory device of claim 9, wherein the second redundancy word lines are selected as the target word lines based on the total number of the first redundancy word lines.

12. The memory device of claim 9, wherein the first redundancy word lines are included in the second redundancy word lines.

13. The memory device of claim 9, wherein odd-numbered redundancy word lines are used for the repair operation after even-numbered redundancy word lines are all used for the repair operation, among the plurality of the redundancy word lines.

14. The memory device of claim 13, wherein the second redundancy word lines are selected as the target word lines based on the total number of third redundancy word lines that are used for the repair operation among the odd-numbered redundancy word lines.

15. The memory device of claim 13, wherein when no word line is used for the repair operation among the odd-numbered redundancy word lines, there is no target word line for the additional refresh operation.

16. The memory device of claim 9, wherein even-numbered redundancy word lines are used for the repair operation after odd-numbered redundancy word lines are all used for the repair operation, among the plurality of the redundancy word lines.

17. The memory device of claim 16, wherein the second redundancy word lines are selected as the target word lines based on the total number of fourth redundancy word lines that are used for the repair operation among the even-numbered redundancy word lines.

18. The memory device of claim 16, wherein when no word line is used for the repair operation among the even-numbered redundancy word lines, there is no target word line for the additional refresh operation.

19. A memory device, comprising:
a plurality of redundancy word lines suitable for repairing a plurality of normal word lines;
a normal refresh circuit suitable for sequentially refreshing first redundancy word lines that are used to repair the plurality of the normal word lines among the plurality of the redundancy word lines, for a refresh operation; and
a redundancy refresh circuit suitable for sequentially refreshing second redundancy word lines that are selected as target word lines among the first redundancy word lines, for an additional refresh operation which is performed once when the refresh operation is performed a predetermined number of times.

20. The memory device of claim 19, wherein the second redundancy word lines are selected as the target word lines based on the total number of the first redundancy word lines.

* * * * *